United States Patent [19]
Tohgo et al.

[11] Patent Number: 6,093,036
[45] Date of Patent: Jul. 25, 2000

[54] TERMINAL CONNECTION DEVICE FOR POWER SUPPLY CIRCUIT

[75] Inventors: Hidenori Tohgo, Yamatokoriyama; Kazuya Chiba, Ibaraki, both of Japan

[73] Assignee: Matsushita Electric Industrial Co., Ltd., Osaka-fu, Japan

[21] Appl. No.: 09/205,717

[22] Filed: Dec. 4, 1998

[30] Foreign Application Priority Data

Dec. 5, 1997 [JP] Japan .................................... 9-335345

[51] Int. Cl.[7] .................................................. H01R 12/00
[52] U.S. Cl. ............................ 439/83; 361/773; 174/261
[58] Field of Search ................................ 439/83, 78, 80, 439/81, 82, 84, 500, 947, 947.2; 174/267, 261, 262; 361/773

[56] References Cited

U.S. PATENT DOCUMENTS

| | | | |
|---|---|---|---|
| 3,159,906 | 12/1964 | Telfer ......................................... 29/843 |
| 3,450,950 | 6/1969 | Tarrats ...................................... 361/796 |
| 3,693,052 | 9/1972 | Galanti ...................................... 361/773 |
| 3,747,045 | 7/1973 | Stross ......................................... 439/55 |
| 3,899,231 | 8/1975 | Bray .......................................... 439/80 |
| 3,925,596 | 12/1975 | Siden ...................................... 174/261 |
| 4,897,624 | 1/1990 | Wignot et al. ............................. 334/80 |
| 5,726,862 | 3/1998 | Huynh et al. ............................ 361/773 |

*Primary Examiner*—Renee Luebke
*Assistant Examiner*—Michael C. Zarroli
*Attorney, Agent, or Firm*—Greenblum & Bernstein P.L.C.

[57] ABSTRACT

In a terminal connection device for a power supply circuit, a connecting lead member (4) has a straight bridge portion (4C) which includes a generally ring-like spin loop portion (5), and has an attachment terminal portion (4B) extending in a hook-shaped manner. The attachment terminal portion (4B) is inserted into a through hole (6) formed in a substrate (1) and fixedly connected by solder (7B) while the ring-like spin loop portion (5) is inserted into a corresponding slot (3) formed in the substrate (1) and securely held therein. The length (L) of the slot (3) is equal to or smaller than the outer diameter (D) of the spin loop portion (5) and the outermost of the spin loop portion comes into close contact with the inner side wall (3a) of the slot (3), and thus the finished terminal connection device can be made thin and small in size.

20 Claims, 5 Drawing Sheets

TERMINAL CONNECTION DEVICE FOR POWER SUPPLY CIRCUIT

BACKGROUND OF THE INVENTION

1. Field of the Invention

The present invention generally relates to a terminal connection device, and more particularly to a terminal connection mechanism for a power supply circuit supplying electric power to various electric and/or electronic devices.

2. Description of the Prior Art

In a task of mounting a terminal connection member such as a metal lead wire for a power supply circuit to a wiring board or substrate used with electric and/or electronic devices, processes of inserting and soldering the connecting member to the wiring board have been largely automated in recent years. The following briefly describes examples of a conventional terminal connection mechanism for a power supply circuit with reference to FIGS. 8 to 10.

As shown in FIG. 8, in the disclosure of Japanese Utility Model Laid-open publication (Jikkai) H1-60366 (in 1989), a battery terminal connection device includes a metal lead 4 which has a straight bridge portion 4C with a coiled spring terminal portion 4A at its one end and an insertion attachment portion 4B at its other end. The metal lead 4 is further provided with a tendril pier portion 4D at its bent portion between the bridge portion 4C and the insertion attachment portion 4B, where the tendril pier portion 4D has a spin loop configuration which is fixed and connected by solder onto a printed pattern layer 2 disposed on a substrate 1. The lead attachment portion 4B is inserted to, but not fastened in, a through hole 6 formed in the substrate in order to prevent the bridge portion 4C from falling over, thereby facilitating the soldering.

In this construction, however, since the connecting lead member is fixed by solder to the substrate by one part thereof, therefore the terminal configuration is ineffective as a means of keeping the connecting member from falling over, that is, the terminal configuration is minimally self-supporting.

A further drawback to the above-noted configuration is that any force applied to the bridge portion is also directly applied to the solder joint of the tendril pier portion 4D, resulting in causing solder cracks and possibly continuity problems.

Yet another drawback is that soldering the tendril pier portion onto the wiring board necessarily increases the overall thickness. As a result, this configuration is unsuited to thin electronic devices.

In another conventional example as shown in FIG. 9, the Japanese Utility Model Laid-open publication (Jikkai) H2-110180 (in 1990) teaches a terminal connection device which includes an elastic metal lead 4 disposed on an insulating substrate 1, where the metal lead 4 has an incurvated loop portion 5 of generally U-character shape protruded downward. The U-shaped loop portion 5 is inserted and securely held in a slot 3 formed at only one location in the substrate 1. In this configuration, by defining the length L of the slot 3 slightly smaller than the outer diameter D of the loop portion 5, the loop portion 5 is elastically engaged in the slot 3. The loop portion 5 held in the slot 3 is fixed and connected to the peripheral printed pattern layer 2 by soldering 7.

However, since this terminal configuration is fixed by solder at only one location, there is a problem in that minimal self-support is provided. In addition, vibration of the substrate, metal lead wire, or lead terminal can cause the wire loop to come out of the hole.

A further problem with this configuration is that the minimum curvature radius R of the typical U-shaped loop portion 5 is necessarily at least three times the diameter d of the lead wire when the loop portion 5 is formed using a coiling machine. This makes it difficult to reduce the overall thickness of the device because of a large height H of the projected loop portion. That is, the height H of the loop portion protruded from the dielectric substrate is thus at least three times the diameter d of the lead wire (i.e., $H \geq R \geq 3d$). Therefore, the thickness of the finished dielectric substrate assembly increases, and this conventional terminal configuration is thus unsuited to thin electronic devices.

In further another example as shown in FIG. 10, the Japanese Patent Registration Publication No. 2658586 (i.e., Laid-open Publication H4-242082) discloses a terminal connection device which includes an elastic metal lead 4 disposed on an insulating substrate 1, where the metal lead 4 has an incurvated loop portion 5 of generally U-character shape and a straight bridge portion 4C with a coiled spring terminal portion 4A at its one end and an insertion attachment portion 4B extending downward at its other end. The U-character shaped loop portion 5 is protruded downward and inserted into a slot 3 formed in the substrate 1 to be thereby elastically engaged therewith by defining the length L of the slot 3 slightly smaller than the outer diameter D of the loop portion 5. The loop portion 5 engaged in the slot 3 is fixed and connected by solder 7A to a peripheral printed pattern layer on a back surface of the substrate. The insertion attachment portion 4B is inserted into a through hole 6 formed in the substrate and then fixed and connected by solder 7B to a peripheral printed pattern layer on the back surface of the substrate. Thus, the lead loop portion can be securely held in the slot 3 in the substrate with effective self-supporting performance, avoiding occurrence of solder cracks.

In this conventional construction, however, the height H of the loop projection portion protruded downward from the dielectric substrate is likewise required to be larger than three times the diameter d of the lead wire (i.e., $H \geq R \geq 3d$). Therefore, the thickness of the finished dielectric substrate assembly increases, and these conventional terminal configurations are thus unsuited to thin electronic devices.

SUMMARY OF THE INVENTION

The present invention has been developed to solve these problems inherent to the conventional terminal connection devices, and an essential object of the present invention is to provide an improvement of a terminal connection device for a power supply circuit, effectively preventing any force applied to a power supply connection part from exerting on a solder joint when connecting such as a battery to the terminal connection device, and thereby maintaining good continuity while a connecting lead member is shaped to achieve a smaller size, and the terminal connection device can therefore be made thinner.

Another object of the invention is to provide a terminal connection device for a power supply circuit in which a connecting lead member can be self-supporting and engaged with a substrate for a circuit board without soldering.

In order to achieve the objects mentioned above, the present invention provides a terminal connection device for a power supply circuit which comprises a connecting lead member attached to a substrate provided with a circuit pattern layer on a surface thereof;

wherein the connecting lead member has a straight bridge portion which is disposed on a surface of the substrate, and has a generally ring-like spin loop portion of a predetermined outer diameter formed in an intermediate portion of the straight bridge portion, and has an attachment terminal portion extending from the straight bridge portion in a hook-shaped manner, wherein the attachment terminal portion is inserted into a through hole formed at a corresponding location in the substrate and fixedly connected by solder to the circuit pattern layer on the substrate, and wherein the ring-like spin loop portion is projected in a direction substantially perpendicular to the bridge straight portion in such a manner that the ring-like spin loop portion is inserted into a slot formed at a corresponding location in the substrate and securely held therein.

In this configuration, a length of the slot is equal to or smaller than the outer diameter of the spin loop portion and the outermost of the spin loop portion comes into close contact with the inner side wall of the slot.

According to an aspect of the present invention, since the spiral spin loop portion is formed of a generally ring-like winding, therefore the outer diameter of the lead loop portion can be reduced to be almost equal to 5 times the diameter of the lead member in the process of forming the spin loop portion using a coiling machine.

Thus, the completed substrate assembly with the terminal connecting device attached thereto can be remarkably reduced in total thickness with improvement of the stability in securing the loop lead portion in the slot, so that the terminal configuration is preferably suited to thin-shaped electronic devices.

Moreover, even if there occurs a crack in the joint solder portion due to an external force applied to the coiled spring terminal, the influence of the external force is not exerted on the joint solder, and thus a stable connecting performance between the attachment lead portion and the circuit pattern layer can be maintained with reduction in cost.

Moreover, since the connecting lead member is fixed to the substrate by two parts thereof, therefore the minimally self-supporting problem can be solved, and even when there is a vibration of the substrate, metal lead wire, or lead terminal, the lead loop portion can be securely held in the slot in stable, remarkably reducing the overall thickness of the device.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

Figure 1:
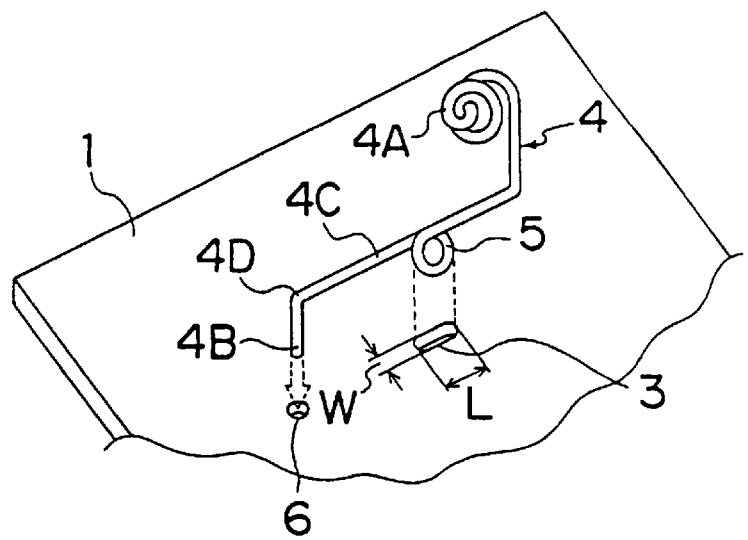
FIG. 1 is a schematic view before assembly of a terminal connection device according to a first embodiment of the present invention.

Before the detailed description proceeds, it is noted that like parts are designated by like reference numerals throughout the accompanying drawings.

The preferred embodiments of a terminal connection device for a power supply circuit according to the present invention are described below with reference to FIGS. 1 to 7.

Embodiment 1

FIG. 1 shows a schematic construction of the first embodiment of a terminal connection device before assembling a terminal connecting member to a substrate of a wiring board.

As shown in FIG. 1, the terminal connection device includes an elastic metal lead 4 of a generally constant diameter to be attached to a substrate 1 of a printed circuit board. The connecting lead member 4 has a generally ring-like spin loop portion 5 of one turn winding and a straight bridge portion 4C. The lead member 4 further includes a coiled spring portion 4A serving as a power supply terminal at its one end and an insertion attachment portion 4B extending downward from a hook-shaped bent portion 4D at its other end. A battery or d.c. power supply unit (not shown) is connected to the spring terminal portion 4A so that electric power is supplied to a circuit pattern layer by way of the insertion attachment portion 4B and the spin loop portion 5 of the metal lead.

In this construction, the extending direction of the attachment lead portion 4B is generally at right angles relative to the straight bridge portion 4C so that the attachment portion 4B is inserted into a through hole 6 formed at a corresponding location in the substrate 1. The diameter of the through hole 6 is defined to be slightly larger than the diameter of the lead attachment portion 4B.

The ring-like spin loop portion 5 is protruded in a downward direction substantially perpendicular to the bridge straight portion 4C, so that the spin loop portion 5 is inserted into a slot 3 which is formed at a corresponding location in the substrate 1 and securely held therein.

In this configuration, a length L of the slot 3 is made substantially equal to or slightly smaller than the outer diameter D of the spin loop portion 5 so that the outermost of the spin loop portion comes into close contact with the inner side wall 3a of the slot 3 in a lengthwise direction of the slot by a spring tension of the spiral winding of the loop lead wire. In the meanwhile, the width W of the slot 3 is made slightly larger than the diameter d of the lead wire 4 to thereby securely hold the spin loop portion 5 therein in a widthwise direction of the slot.

In this embodiment, the lead wire 4 having a diameter of, for example, d=0.5 mm, 0.55 mm or 1.0 mm is practically used while the thickness S of the substrate 1 is practically defined as, for example, 1.0 mm, 1.2 mm or 1.6 mm. However, these values are merely examples and it is needless to say that other values thereof can be also used.

Figure 2:
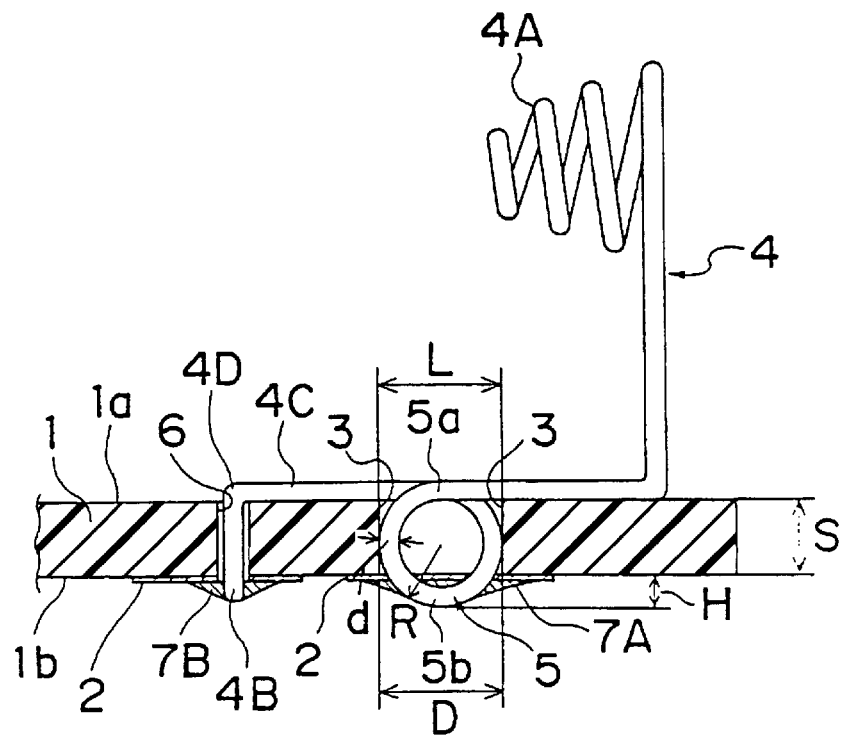
FIG. 2 is a side section view of the assembled terminal connection device shown in FIG. 1.
Figure 3:
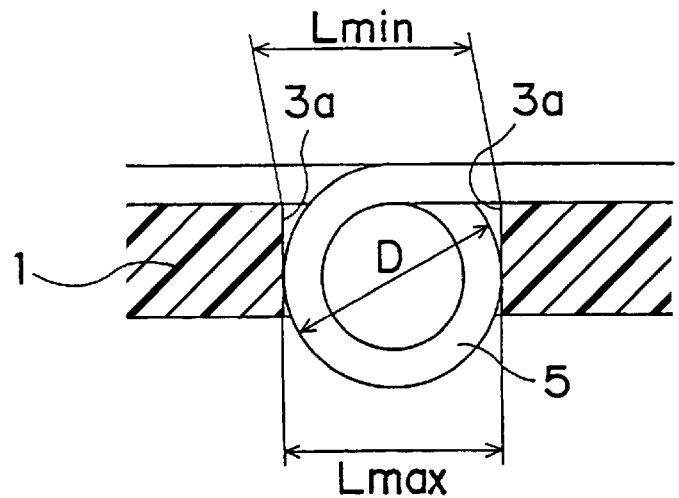
FIG. 3 is a side section view of an essential part of the terminal connection device according to a modified embodiment of the present invention.

FIGS. 2 and 3 show an essential part in cross section of the assembly of the terminal connection device shown in FIG. 1.

As shown in FIGS. 2 and 3, in this embodiment, the inner wall 3a of the slot 3 is, for example, substantially perpendicular relative to a surface 1a (or 1b) of the substrate 1, and the spin loop portion 5 held in the slot 3 is fixed and connected by solder 7A to a peripheral printed pattern layer 2 via a soldering foil (not shown) provided on a back surface 1b of the substrate 1. The attachment portion 4B inserted into the through hole 6 is also fixed and connected by solder 7B via a soldering foil to a peripheral printed pattern layer 2 on the back surface of the substrate. In a practical manufacturing process of this assembly, the insertion and soldering processes of the connecting lead member 4 may be automatically performed.

Thus, the spin loop portion can be securely held in the slot 3 of the substrate with effective self-supporting, avoiding occurrence of solder cracks.

In this embodiment, although the circuit pattern layer 2 is provided on a back surface of the substrate, it is noted here that the circuit pattern layer may be also provided on a top surface of the substrate.

In this construction, since the spiral spin loop portion 5 is formed of a generally ring-like winding, therefore the outer diameter D of the lead loop portion can be reduced to be almost equal to 5 times the diameter d of the lead wire 4. That is, the smallest curvature radius R of the loop portion 5 is necessarily almost 2.5 times the diameter d in the process of forming the spin loop portion using a coiling machine.

Thus, a projection height H of the loop portion protruded downward from the substrate surface can be largely reduced compared to those of the conventional devices.

In experimental tests of manufacturing the terminal connection devices, the inventors of the present invention found the fact that the minimal necessary height H of the protruded loop portion downward from the back surface of the substrate can be reduced to be substantially equal to the diameter d of the lead wire on the premise that the outer diameter D of the lead loop portion is equal to or larger than 5 times the diameter d of the lead wire. That is, when the smallest height H of the protruded portion is defined as a length of at least the diameter d, it is sufficient to securely hold the loop portion 5 in the slot 3. In this minimum thin configuration, the majority of the spin loop portion 5 corresponding to the inner diameter portion in depthwise direction is held within the slot 3 while only the top and bottom parts 5a, 5b of the spin loop lead 5 are protruded outside the top and bottom surfaces 1a, 1b of the substrate 1, respectively. In this thinnest construction, the following equation is satisfied:

$$D = S + 2d \quad (D \geq 5d, \; H = d)$$

In this preferred embodiment, although the spiral winding of the spin loop portion 5 is formed of one turn winding, it is noted here that the winding turn number thereof is not limited to one, and two or more turns of the spiral windings may be easily formed for the spin loop portion 5 as a modified example. In this modification, the insertion of the spin loop portion into the slot 3 can be more secured and stable under the condition that the width W of the slot 3 is defined in accordance with the turn number of the windings. Stability is improved by which the loop portion is held in the slot, thus avoiding undesirable irregular lean or bend of the loop when inserting the loop into the slot.

In a modified example of the embodiment, it is noted here that there may be formed a bent or curved portion in the straight bridge portion 4C of the lead member 4 disposed on the substrate.

In another modified example of the embodiment, as shown in FIG. 3, in order to more securely hold the spin loop portion in the slot in a stable fashion, the inner side wall 3a of the slot 3 may be non-perpendicular, i.e., slightly tapered so that the slot has a trapezoid-like shape in cross section view. In specifically, the length L of the slot may be varied in accordance with its depthwise position in such a manner that the length L of the slot is minimum (Lmin) at its top position (i.e., surface 1a). Its length is gradually increased as the depth position of the slot extends downward from the top position. The length L is maximum (Lmax) at its bottom position (i.e., surface 1b). Further, the minimum length Lmin of the slot at its top position is defined to be slightly smaller by a predetermined length than the outer diameter D of the lead loop portion 5.

In this construction, it is noted here that, by defining the maximum length Lmax of the slot at its bottom position to be substantially equal to the outer diameter D of the spin loop portion 5, the spin loop portion 5 inserted in the slot 3 can be mechanically fixed in close contact with the peripheral printed pattern layer 2 provided on the back surface of the substrate without providing the solder 7A.

Thus, the completed substrate assembly with the terminal connecting device attached thereto can be remarkably reduced in total thickness with improvement of stability in securing the loop lead portion in the slot, so that the terminal configuration of this embodiment is preferably suited to thin-shaped electronic devices.

Moreover, in this embodiment, even if there occurs a crack in the joint solder portion 7A due to an external force applied to the coiled spring terminal 4A, the influence of the external force is not exerted on the joint solder 7B, and thus a stable connecting performance between the attachment lead portion 4B and the circuit pattern layer 2 can be maintained with reduction in cost.

Moreover, since the connecting lead member 4 is fixed to the substrate by two parts thereof, therefore the minimally self-supporting problem can be solved, and even when there is a vibration of the substrate, metal lead wire, or lead terminal, the lead loop portion can be securely held in the slot in stable, remarkably reducing the overall thickness of the device.

Embodiment 2

Figure 4:
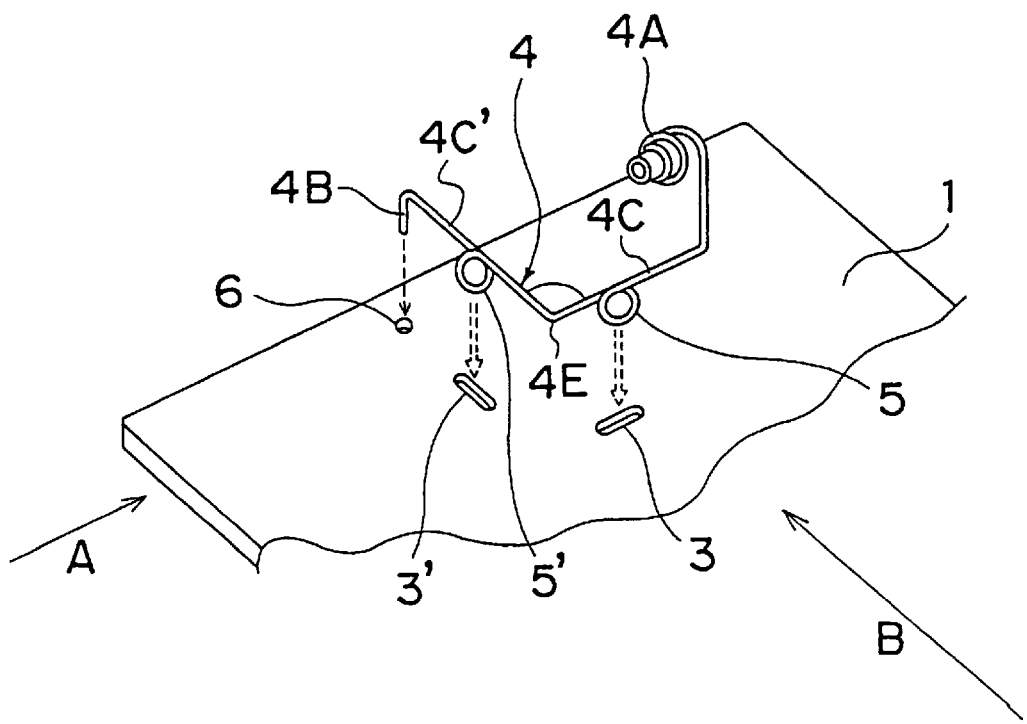
FIG. 4 is a schematic view before assembly of a terminal connection device according to a second embodiment of the present invention.
Figure 5:
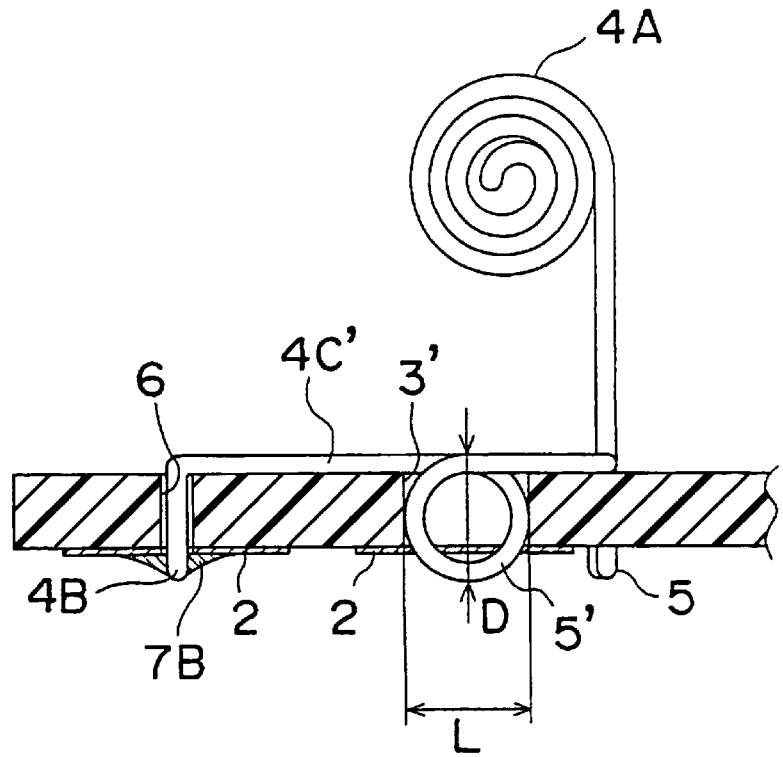
FIG. 5 is a side section view of the assembled terminal connection device viewing in a line A direction shown in FIG. 4.
Figure 6:
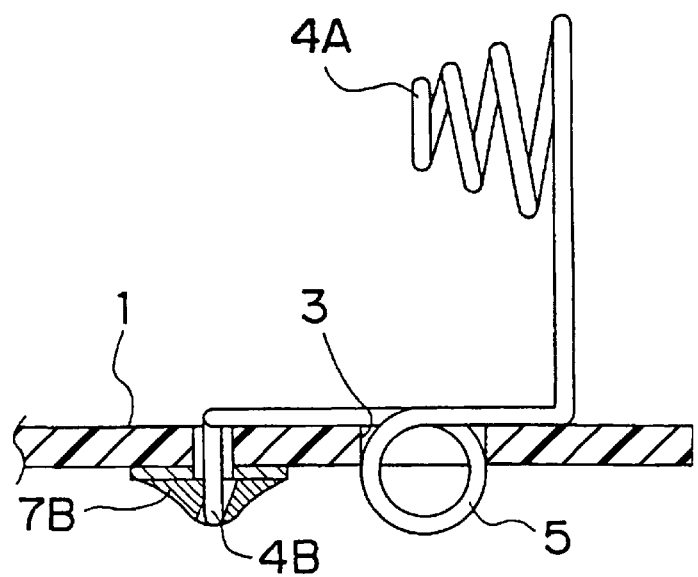
FIG. 6 is a section view of the assembled terminal connection device viewing in a line B direction shown in FIG. 4.

FIGS. 4, 5 and 6 show a second embodiment of a terminal connection device according to the present invention.

As shown in FIG. 4, a specific feature of this embodiment distinct from the first embodiment resides in the fact that the connecting lead member 4 has two ring-like spiral parts of a generally O-character shape, i.e., first and second ring-like spin loop portions 5 and 5', which are formed in the first and second straight bridge portions 4C and 4C' of the lead member, respectively. The lead member 4 is bent at a predetermined angles such as e.g. substantially right angles at its intermediate portion 4E, so that the first and second straight bridge portions 4C and 4C' are extended generally perpendicular to each other. Therefore, the first and second spin loop portions 5 and 5' are formed such that the center axes thereof are substantially perpendicular to each other.

Mounting slot holes 3 and 3' for the first and second spin loop portions 5 and 5' are formed in the printed circuit board 1 at appropriate locations corresponding to the locations of the first and second spin loop portions, respectively.

In this construction, the lead attachment terminal 4B and the first and second spin loop portions 5 and 5' are inserted into the hole 6 and slots 3 and 3' respectively and then fixed therein. The attachment terminal 4B and at least one of the first and second spin loop portions 5 and 5' are connected by solder to the peripheral circuit pattern layer. Thus, in assembling the lead member mounted on the substrate, the inserting and soldering processes of the terminal lead portions can be automated with high security in stable.

FIG. 5 is a side section view of the assembled terminal connection device when viewing in a direction of an arrow mark A in FIG. 4.

Referring to FIG. 5, the attachment lead portion 4B is inserted to the mounting hole 6 formed in the substrate 1 of the printed circuit board and then fastened to the printed circuit pattern layer 2 by solder 7B. The second spin loop portion 5' is inserted to the corresponding second slot 3' formed in the substrate and then fastened to the printed circuit pattern layer 2 by solder 7A as shown in FIG. 2.

In a modified example, the length L of the second slot 3' may be less than the outer dimension D of the spin loop portion 5', thereby enabling the slot 3' to secure the spin loop terminal part 5' inserted thereto by means of resilient contact against the sides of the slot 3'. The first and second slots 3 and 3' and corresponding spin loop portions 5 and 5' thus function to stably support and engage the connecting lead member 4 without soldering.

In this construction, the outer diameter D of the spin loop portion 5' is defined to be the smallest diameter within the range enabling the self-supporting performance as well as enabling the soldering to the printed circuit pattern. By thus minimizing the projecting height H from the back surface of the substrate, the assembly of the terminal connection device can be made remarkably thin and compact.

FIG. 6 shows an example of the assembled terminal connection device when viewing in a direction of an arrow mark B in FIG. 4.

In this embodiment, the first spin loop part 5 near the power supply terminal 4A is not soldered. Thus, when any force is applied to the power supply terminal 4A by connecting e.g. a battery thereto, this external force acts on the unsoldered first spin loop part 5 nearer the power supply terminal 4A and then the applied force is absorbed by the slot 3. As a result, the external force is not transmitted to and does not act on the solder 7A of the second spin loop terminal part 5', and good terminal continuity can thus be maintained.

In this embodiment 2, although two ring-like spin loop portions are provided in the lead member, it is noted here that, in a modified example, there may be formed only one ring-like spin loop portion in any one of the first and second straight bridge portions 4C and 4C'.

Figure 7:
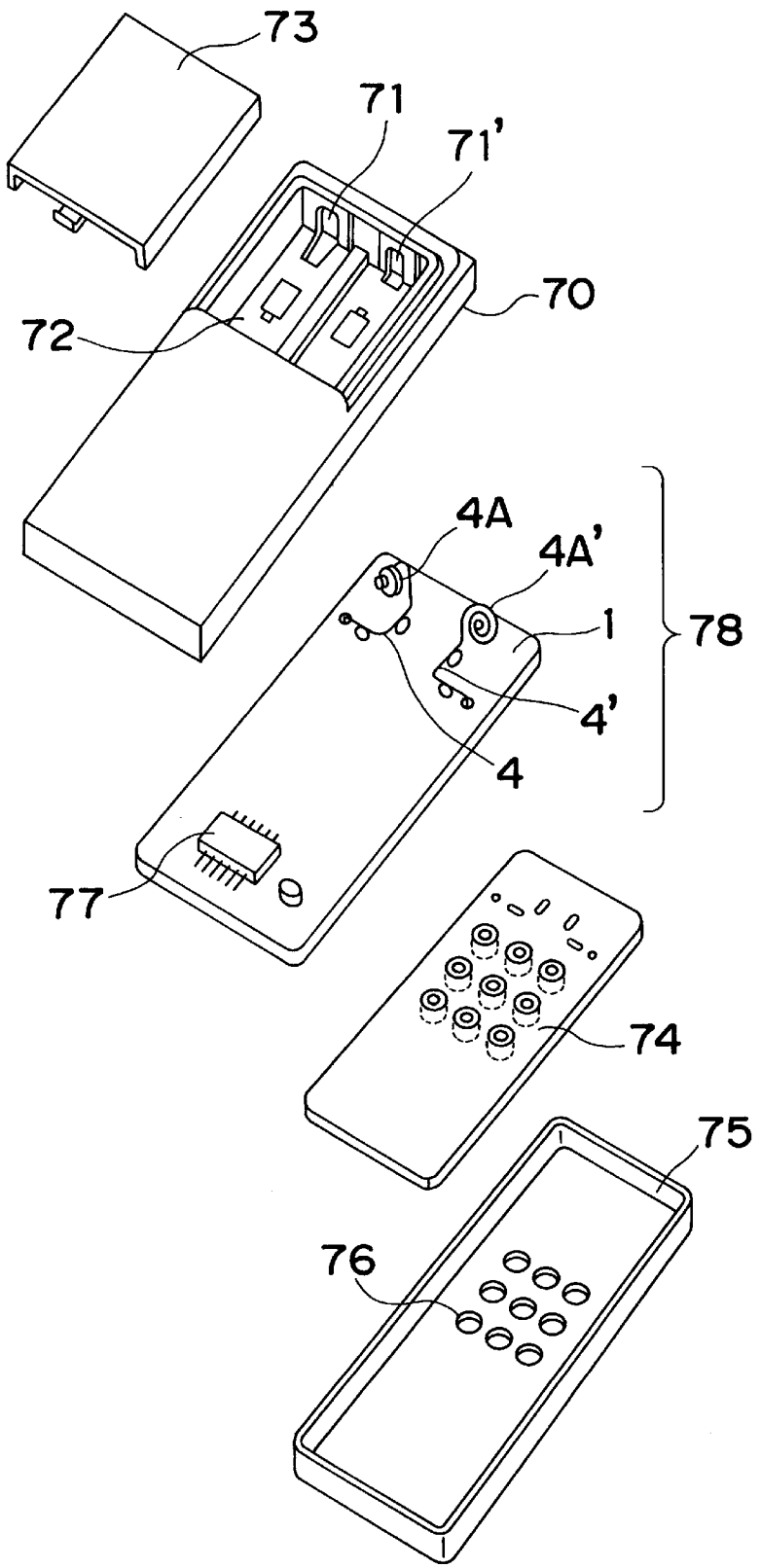
FIG. 7 is a partially exploded view of a remote control transmitter in which a terminal connection device according to the invention is used.
Figure 8:
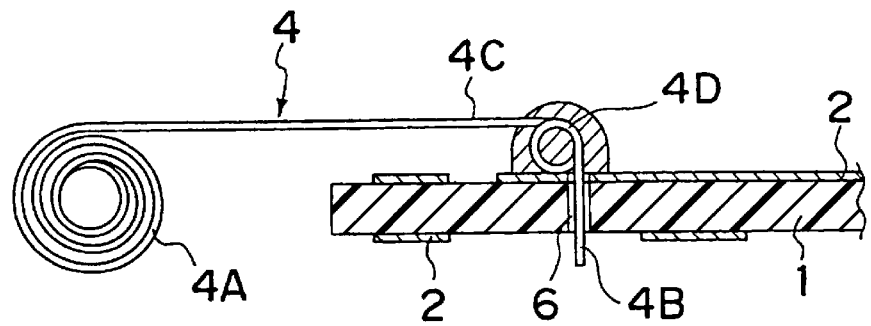
FIG. 8 is a side section view of a conventional terminal connection device having an insertion attachment lead portion.
Figure 9:
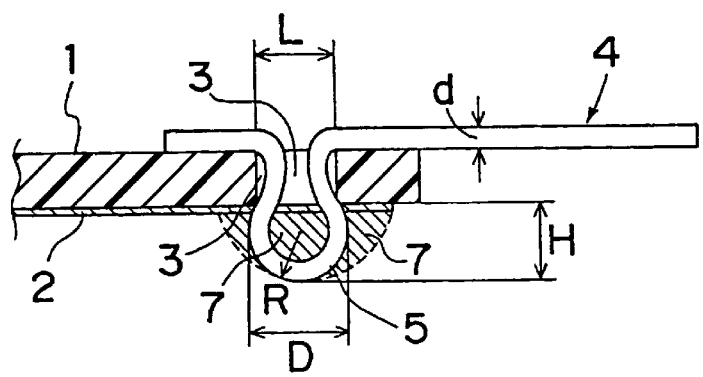
FIG. 9 is a side section view of another conventional terminal connection device having a substantially U-shaped loop lead portion.
Figure 10:
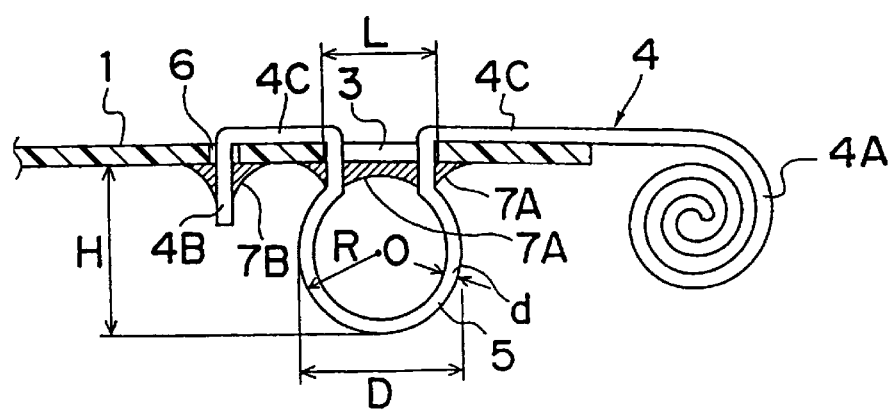
FIG. 10 is a side section view of a further another conventional terminal connection device having a substantially U-shaped loop lead portion.

FIG. 7 is a partially exploded view when viewing from a back of a remote control transmitter in which a terminal connection device for a power supply circuit according to the invention is used.

Referring to FIG. 7, a first power supply terminal 4A on the positive (+) side, and a second power supply terminal 4A' on the negative (−) side, are each paired with a connecting lead member 4 (and 4').

A finished circuit board assembly 78 comprises a terminal connection device according to the present invention, including power supply terminals 4A and 4A', connecting members 4 and 4', printed circuit board 1, and electronic component 77.

A bottom case 70 comprises compartments 71 and 71' for housing power supply terminals 4A and 4A', and a recess 72 for housing a battery. A power supply compartment cover 73 is attached to and closes the bottom case 70. A plurality of operating buttons 74 with a protruding shape are typically formed of rubber, and are inserted to holes 76 formed in a top case 75.

It will be obvious to one with ordinary skill in the related art that while the hook-shaped lead attachment terminal part 4B and the second spin loop terminal part 5' are described as being soldered at two locations to the printed circuit board on the side opposite the power supply terminal 4A, the invention shall not be so limited. More specifically, depending upon the configuration of the solder side of the printed circuit board, the lead attachment terminal 4B and the second spin loop terminal part 5' can be soldered on the same side as the power supply terminal 4A.

It will also be obvious that when the force typically applied to the power supply connector is small, soldering at only one location will be sufficient.

As will be known from the above description of the present invention, a terminal connection device for a power supply circuit according to these preferred embodiments of the invention can prevent an applied force from acting on a solder joint even when the force is applied to the power supply connection part, such as when connecting a battery to the power supply circuit terminal, thus maintaining good continuity.

In addition, a terminal connection device according to the present invention provides a connecting member that can be securely engaged with the substrate without soldering the connecting member to the circuit board. The ring-like shape of the connecting member also enables the terminal connection device to be made small in overall size, and a thinner terminal connection device can thus be achieved.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A terminal connection device for a power supply circuit comprising a connecting lead member of a substantially constant diameter attached to a substrate having a circuit pattern layer provided thereon, said connecting lead member having a bridge portion which is disposed on a surface of the substrate, and having a ring-like spin loop portion of a predetermined outer diameter formed at an intermediate portion of the bridge portion, and having an attachment terminal portion extending from the bridge portion in a hook-shaped manner, wherein said attachment terminal portion extends through a hole formed at a corresponding location in the substrate and is fixedly connected by solder to the circuit pattern layer on the substrate, and wherein said ring-like spin loop portion extends in a direction substantially perpendicular to the bridge portion, said ring-like spin loop portion extending into a slot formed at a corresponding location in the substrate and being securely held in said slot, said predetermined outer diameter of said ring-like spin loop portion having a size such that a majority of said loop is contained within a thickness of said substrate.

2. The terminal connection device as claimed in claim 1, wherein the extending direction of the attachment terminal portion is generally at right angles relative to the bridge portion.

3. The terminal connection device as claimed in claim 1, wherein a diameter of the through hole is slightly larger than the diameter of the lead member.

4. The terminal connection device as claimed in claim 1, wherein a length of the slot is at most equal to the outer diameter of the spin loop portion and the outermost surface of the spin loop portion comes into close contact with the inner side wall of the slot.

5. The terminal connection device as claimed in claim 1, wherein the outer diameter of the spin loop portion is at least five times the diameter of the connecting lead member.

6. The terminal connection device as claimed in claim 5, wherein the outer diameter of the spin loop portion is larger than a thickness of the substrate to form a projection portion projected through the slot from a bottom surface of the substrate.

7. The terminal connection device as claimed in claim 6, wherein a height of the projection portion from the bottom surface of the substrate is at least the diameter of the connecting lead member.

8. The terminal connection device as claimed in claim 7, wherein the projection portion of the spin loop portion held in the slot is fixedly connected by solder to the circuit pattern layer on the substrate.

9. The terminal connection device as claimed in claim 1, wherein the inner wall of the slot is substantially perpendicular relative to the surface of the substrate.

10. The terminal connection device as claimed in claim 7, wherein only top and bottom parts of the spin loop lead protrude outside the top and bottom surfaces of the substrate, respectively, satisfying the following equation:

$$D=S+2d \ (D \geq 5d, H=d)$$

where D is an outer diameter of the spin loop portion, d is a diameter of the lead member, S is a thickness of the substrate, and H is a height of the projection portion of the spin loop portion.

11. The terminal connection device as claimed in claim 1, wherein the inner side wall of the slot is non-perpendicular and slightly tapered so that the slot has a trapezoid-like shape in cross section view.

12. The terminal connection device as claimed in claim 11, wherein the length of the slot is varied in accordance with its depthwise position in such a manner that the length of the slot is minimum at its top position and is gradually increased as the depth position of the slot goes downward from the top position and the length is maximum at its bottom position, wherein the minimum length of the slot at its top position is slightly smaller than the outer diameter of the spin loop portion.

13. The terminal connection device as claimed in claim 12, wherein the maximum length of the slot at its bottom position is substantially equal to the outer diameter of the spin loop portion, and the spin loop portion inserted in the slot is mechanically fixed in close contact with the peripheral circuit pattern layer provided on the substrate without solder.

14. The terminal connection device as claimed in claim 1, wherein the connecting lead member is bent in a hook shape at its intermediate portion to form first and second bridge portions which have first and second ring-like spin loop portions formed in the intermediate portions thereof, respectively, and wherein first and second slots are formed in the substrate at appropriate locations corresponding to the locations for the first and second spin loop portions, respectively, and the first and second spin loop portions extend into and are fixed in the first and second slots, respectively.

15. The terminal connection device as claimed in claim 14, wherein the first and second bridge portions extend generally perpendicular to each other, and the center axes of the first and second spin loop portions are substantially perpendicular to each other.

16. The terminal connection device as claimed in claim 14, wherein at least one of the first and second spin loop portions are connected by solder to the peripheral circuit pattern layer.

17. The terminal connection device as claimed in claim 1, wherein the winding of the ringlike spin loop portion is formed of a plurality of turn windings.

18. A terminal connection device for a power supply circuit comprising a connecting lead member of a substantially constant diameter attached to a substrate having a circuit pattern layer provided thereon, said connecting lead member having a bridge portion which is disposed on a surface of the substrate, and having a ring-like spin loop portion of a predetermined outer diameter formed at an intermediate portion of the bridge portion, and having an attachment terminal portion extending from the bridge portion in a hooked-shape manner, wherein said attachment terminal portion extends through a hole formed at a corresponding location in the substrate and is fixedly connected to the circuit pattern layer on the substrate, and wherein said ring-like spin loop portion extends in a direction substantially perpendicular to the bridge portion, said ring-like spin loop portion extending into a slot formed at a corresponding location in the substrate and being securely held in said slot, said ring-like spin loop portion comprising a loop of at least 360°.

19. The terminal connection device according to claim 18, said intermediate portion of said connecting lead member having a bend to thereby form first and second bridge portions, each of said bridge portions having a ring-like spin loop portion formed at an intermediate portion of said first and second bridge portions, first and second slots being provided in the substrate at locations corresponding to the locations of the first and second spin loop portions, said first and second spin loop portions extending into and being fixed within said first and second slots respectively.

20. A terminal connection device according to claim 19, said first and second bridge portions extend generally perpendicularly to each other, and center axes of said first and second spin loop portions being substantially perpendicularly to each other.

* * * * *

UNITED STATES PATENT AND TRADEMARK OFFICE
CERTIFICATE OF CORRECTION

PATENT NO.   : 6,093,036
DATED        : July 25, 2000
INVENTOR(S)  : H. TOHGO et al.

It is certified that error appears in the above-identified patent and that said Letters Patent is hereby corrected as shown below:

On the cover of the printed patent, at Item [56], References Cited, the following Foreign Patent Documents were omitted and should be added:
       —2658586   06/06/97    Japan
        1-60366    04/17/89    Japan
        2110180   09/04/90    Japan—

On the cover of the printed patent, at Item [56], References Cited, the following Other Publications were omitted and should be added:
       ---An English Language Abstract of JP 2-658586
        An English Language Abstract of JP 1-60366
        An English Language Abstract of JP 2-110180---

Signed and Sealed this

Fifteenth Day of May, 2001

Attest:

NICHOLAS P. GODICI

*Attesting Officer*        *Acting Director of the United States Patent and Trademark Office*